(12) United States Patent
Xu et al.

(10) Patent No.: US 10,957,552 B2
(45) Date of Patent: Mar. 23, 2021

(54) EXTREME ULTRAVIOLET LITHOGRAPHY PATTERNING WITH DIRECTIONAL DEPOSITION

(71) Applicant: International Business Machines Corporation, Armonk, NY (US)

(72) Inventors: Yongan Xu, San Jose, CA (US); Ekmini Anuja De Silva, Slingerlands, NY (US); Su Chen Fan, Cohoes, NY (US); Yann Mignot, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/666,948

(22) Filed: Oct. 29, 2019

(65) Prior Publication Data

US 2020/0098581 A1 Mar. 26, 2020

Related U.S. Application Data

(62) Division of application No. 16/139,819, filed on Sep. 24, 2018, now Pat. No. 10,658,190.

(51) Int. Cl.
*H01L 21/308* (2006.01)
*G03F 1/22* (2012.01)
*H01L 21/033* (2006.01)

(52) U.S. Cl.
CPC ............ *H01L 21/3086* (2013.01); *G03F 1/22* (2013.01); *H01L 21/0337* (2013.01)

(58) Field of Classification Search
CPC ............ H01L 21/3086; H01L 21/0337; H01L 21/31144; G03F 1/22
See application file for complete search history.

(56) References Cited

U.S. PATENT DOCUMENTS

| | | |
|---|---|---|
| 6,368,988 B1 | 4/2002 | Li et al. |
| 8,809,194 B2 | 8/2014 | Ranjan et al. |
| 8,883,374 B2 | 11/2014 | Altamirano Sanchez |
| 8,906,760 B2 | 12/2014 | Ranjan et al. |

(Continued)

OTHER PUBLICATIONS

L. Meng et al., "Transistor Gate Line Roughness Formation and Reduction in sub-30-nm Gate Patterning Using Multilayer Hard Mask Structure," Journal of Micro-Nanolithography, MEMS, and MOEMS, Aug. 27, 2014, 8 pages, vol. 13, No. 3.

(Continued)

*Primary Examiner* — Galina G Yushina
(74) *Attorney, Agent, or Firm* — Abdy Raissinia; Ryan, Mason & Lewis, LLP

(57) ABSTRACT

Semiconductor structures fabricated via extreme ultraviolet (EUV) lithographic patterning techniques implementing directional deposition on a EUV resist mask improves selectivity and critical dimension control during the patterning of features in multiple layers of the semiconductor substrate. A semiconductor structure includes a substrate structure having an extreme ultraviolet resist mask disposed over one or more additional layers of the substrate structure. The extreme ultraviolet resist mask defines patterning features. A hard mask layer including a hard mask material is disposed on the extreme ultraviolet resist mask and covers the patterning features of the extreme ultraviolet resist mask.

20 Claims, 8 Drawing Sheets

(56) References Cited

U.S. PATENT DOCUMENTS

| | | |
|---|---|---|
| 9,093,561 B2 | 7/2015 | Yu et al. |
| 9,202,920 B1 | 12/2015 | Liu et al. |
| 9,722,024 B1* | 8/2017 | Xie .................. H01L 21/82343 |
| 2007/0037410 A1 | 2/2007 | Chang et al. |
| 2010/0181677 A1* | 7/2010 | Edelstein .................. G03F 7/00 |
| | | 257/773 |
| 2010/0210112 A1 | 8/2010 | Shen et al. |
| 2013/0199925 A1 | 8/2013 | Cao et al. |
| 2014/0070283 A1 | 3/2014 | Kim et al. |
| 2015/0228812 A1* | 8/2015 | Tanaka ................ H01L 31/1868 |
| | | 136/256 |
| 2016/0329207 A1 | 11/2016 | Mohanty et al. |
| 2016/0380066 A1 | 12/2016 | Lin et al. |
| 2018/0166562 A1* | 6/2018 | Ning .................. H01L 21/47635 |
| 2018/0259842 A1* | 9/2018 | Inazuki ..................... G03F 1/58 |
| 2018/0292756 A1* | 10/2018 | Kong ................ H01L 21/31144 |
| 2018/0330994 A1 | 11/2018 | Zang et al. |
| 2018/0342588 A1* | 11/2018 | Miki ..................... H01L 29/205 |
| 2019/0035631 A1* | 1/2019 | Chang ................ H01L 21/0335 |

OTHER PUBLICATIONS

List of IBM Patents or Patent Applications Treated as Related.

* cited by examiner

100

100

100

100

100

100

US 10,957,552 B2

EXTREME ULTRAVIOLET LITHOGRAPHY PATTERNING WITH DIRECTIONAL DEPOSITION

TECHNICAL FIELD

This disclosure generally relates to semiconductor fabrication techniques and, more specifically, to extreme ultraviolet (EUV) lithographic patterning methods for use in fabricating semiconductor integrated circuits.

BACKGROUND

Various types of multi-patterning photolithography techniques can be utilized to manufacture semiconductor integrated circuits. Such multi-patterning techniques include sidewall image transfer (SIT), self-aligned doubled patterning (SADP), and self-aligned quadruple patterning (SAQP) techniques, for example. The current SIT, SADP and SAQP methods utilize deposition and etch back processes to create uniform memorization and transfer elements. In particular, these techniques involve spacer patterning steps in which spacers are formed on the sidewalk of sacrificial features (e.g., sacrificial mandrels), wherein the sacrificial features are removed to leave a pattern of spacers which is used to etch features into an underlying layer at sub-lithographic dimensions.

For next generation technology nodes, e.g., 10 nm and beyond, these multi-patterning methods will become costlier and more complex because of the need to fabricate and utilize multiple levels of masks (e.g., mandrel mask, block masks, cut masks, etc.) to perform such methods. The use of multiple masks adds considerable design complexity and unwanted process variations due to limitations in mask fabrication technologies. In this regard, the semiconductor industry is considering next-generation EUV lithography technologies to replace or augment such multi-patterning methods. The EUV lithography with exposure wavelengths below 40 nm would allow the semiconductor industry to print features beyond the diffraction limit of the current 193 nm lithography (ArF radiation wavelength). However, EUV lithographic patterning methods require the use of relatively thin EUV resist masks for patterning sub-36 nm pitch features to prevent resist "flop-over." Moreover, EUV resist masks undergo more surface etching (resulting in reduction of mask thickness) as compared to ArF resist mask during drying etch processes such as reactive-ion etching (RIE).

SUMMARY

Embodiments of the invention include EUV lithographic patterning methods which implement directional deposition on the EUV resist mask to improve selectivity and critical dimension control during the patterning of features in multiple layers. In one illustrative embodiment, a semiconductor structure comprises a substrate structure including an extreme ultraviolet resist mask disposed over one or more additional layers of the substrate structure. The extreme ultraviolet resist mask defines patterning features. A hard mask layer comprising a hard mask material is disposed on the extreme ultraviolet resist mask and covers the patterning features of the extreme ultraviolet resist mask.

In another illustrative embodiment, a semiconductor structure comprises a substrate including a first hard mask layer and a resist mask over the hard mask layer. The resist mask comprises patterning features that define an image of openings therebetween to be used for patterning at least one layer of the substrate. A hard mask material forming a second hard mask layer covers the patterning features of the resist mask without substantial covering of portions of the first hard mask layer disposed between the openings of the image of the resist mask.

In yet another illustrative embodiment, a semiconductor device, comprises a semiconductor substrate, one or more layers disposed on the semiconductor substrate, a first hard mask layer disposed on the one or more layers and a resist mask disposed on the hard mask layer. The resist mask comprises a pattern defining image openings to be used for patterning the one or more layers. The pattern includes at least first and second mask portions with at least one of the image openings disposed therebetween. The first mask portion defines a first thickness and the second mask portion defines a second thickness greater than the first thickness. Each of the first and second mask portions extends from the first hard mask layer to define respective upper surfaces and side wall surfaces. A hard mask material forming a second hard mask layer covers the upper surfaces of the first and second mask portions whereby the side wall surfaces of the first and second mask portions and portions of the first hard mask layer disposed between the image openings of the resist mask are substantially devoid of the hard mask material.

Other embodiments will be described in the following detailed description of embodiments, which is to be read in conjunction with the accompanying figures.

BRIEF DESCRIPTION OF THE DRAWINGS

FIGS. 1 through 10 schematically illustrate an EUV lithographic patterning method which implements directional deposition on the EUV resist mask to improve selectivity and critical dimension control during the patterning of features in multiple layers, according to an embodiment of the invention, wherein:

FIG. 1 is a schematic cross-sectional side view of a semiconductor device at an intermediate stage of fabrication, which comprises a substrate structure;

FIG. 2 is a schematic cross-sectional side view of a semiconductor device of FIG. 1 after formation of an EUV resist mask on an underlying hard mask layer of the substrate structure;

FIG. 3 is schematic cross-sectional side view of the semiconductor device of FIG. 2 after directional deposition of a hard mask material on the substrate structure to form a hard mask layer covering patterning features of the EUV resist mask;

FIG. 4 is a schematic cross-sectional side view of the semiconductor device of FIG. 3, after etching of the hard mask material to remove any hard mask material disposed on the underlying hard mask layer without uncovering the patterning features of the EUV resist mask;

FIG. 5 is a schematic cross-sectional side view of the semiconductor device of FIG. 4, after patterning the underlying hard mask layer using the EUV resist mask and the hard mask layer covering the patterning features of the EUV resist mask;

FIG. 6 is a schematic cross-sectional side view of the semiconductor device of FIG. 5, after patterning an organic planarizing layer of the substrate structure using the pattern transferred to the underlying hard mask layer;

FIG. 7 is a schematic cross-sectional side view of the semiconductor device of FIG. 6, after patterning a first layer of an etch mask pattern of the substrate structure using the pattern transferred to the organic planarizing layer;

FIG. 8 is a schematic cross-sectional side view of the semiconductor device of FIG. 7, after patterning a second layer of the etch mask pattern using the pattern transferred to the first layer of the etch mask pattern;

FIG. 9 is a schematic cross-sectional side view of the semiconductor device of FIG. 8, after patterning a sacrificial hard mask layer of the substrate structure using the pattern transferred to the second layer of the etch mask pattern; and FIG. 10 is a schematic cross-sectional side view of the semiconductor device of FIG. 9, after patterning an insulating layer of the substrate structure using the pattern transferred to the sacrificial hard mask layer.

DETAILED DESCRIPTION

Figure 1:
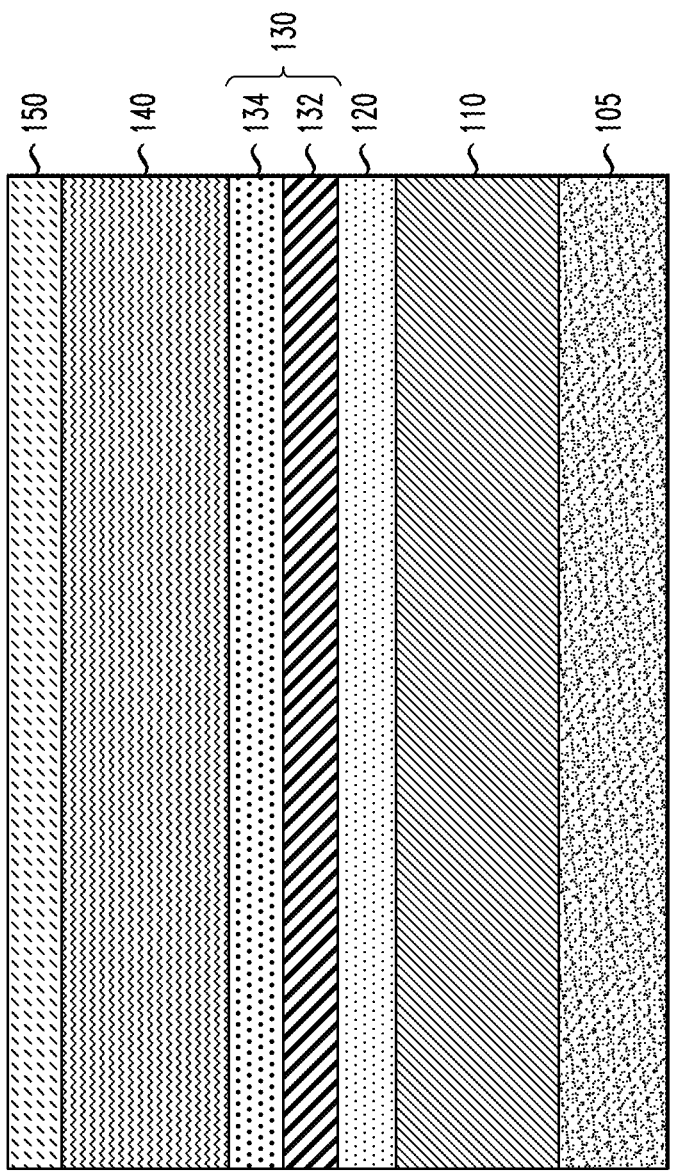

Embodiments of the invention will now be described in further detail with regard to EUV lithographic patterning methods which implement directional deposition of a hard mask material on the EUV resist mask to improve selectivity and critical dimension control during the patterning of features in multiple layers. As explained in further detail below, embodiments of the invention include methods to reduce line break occurrence during transfer of a pattern defined by an EUV resist mask to an underlying layer due to portions of the EUV resist mask having decreased thickness such as, e.g., dents or divots. The method includes the formation of a hard mask layer on patterning features, e.g., surfaces, of the EUV resist mask which inhibit the occurrence of line breaks by covering the patterning features, especially in cases where portions of the patterning features have a reduced thickness. For example, the addition of the hard mask layer on the patterning features of the EUV resist mask inhibit later etching from removing the portions of the EUV resist mask that have reduced thickness during transfer of the pattern to the underlying layers, thereby inhibiting the occurrence of line breaks in the transferred pattern. The exemplary EUV patterning methods discussed herein can be implemented for next generation technology nodes, e.g., 7 nm and beyond for patterning nano-features with pitches of 36 nm and below. In particular, the exemplary EUV patterning methods discussed herein can be implemented for patterning features in front-end-of-line (FEOL) layers, middle-of-line (MOL) layers, and back-end-of-line (BEOL) layers. For illustrative purposes, EUV patterning methods according to embodiments of the invention will be discussed in the context BEOL process modules for patterning via holes and metal line trenches in dielectric layers with pitches of, e.g., 36 nm and below.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. It is to be further understood that references herein to formation of one layer or structure "on" or "over" another layer or structure are intended to be broadly construed, and should not be interpreted as precluding the presence of one or more intervening layers or structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

FIGS. 1 through 10 schematically illustrate an EUV lithographic patterning method which implements directional deposition on an EUV resist mask to improve selectivity and critical dimension control during the patterning of features in multiple layers, according to an embodiment of the invention. FIG. 1 is a schematic cross-sectional side view a semiconductor device 100 at an intermediate stage of fabrication, illustrating a substrate structure of the semiconductor device 100 comprising a substrate 105, an insulating layer 110, a sacrificial hard mask layer 120 (e.g., sacrificial nitride layer), an etch mask pattern 130, an organic planarizing layer (OPL) 140, and a hard mask layer 150 disposed on OPL 140. In one embodiment, the hard mask layer 150 comprises an anti-reflection coating (ARC) layer formed of amorphous silicon (e.g., a Si-ARC layer).

The insulating layer 110 may be formed on a substrate 105 which, in one embodiment, the comprises various layers including, for example, a base semiconductor substrate (e.g., semiconductor wafer), and an FEOL/MOL stack comprising integrated circuitry and interconnect layers/structures that are formed on the base semiconductor substrate prior to forming the insulating layer 110. In one embodiment, the base semiconductor substrate may be a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. group III-V). Non-limiting examples of compound semiconductor materials include gallium arsenide, indium arsenide, and indium phosphide. In another embodiment, the base semiconductor substrate may be a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of the FEOL layer.

The FEOL layer comprises various semiconductor devices and components that are formed in or on the active surface of the semiconductor substrate to provide integrated circuitry for a target application. For example, the FEOL layer comprises FET devices (such as FinFET devices, planar MOSFET devices, etc.), bipolar transistors, diodes, capacitors, inductors, resistors, isolation devices, etc., which are formed in or on the active surface of the semiconductor substrate. The MOL layer comprises one or more MID (pre-metal dielectric) layers and conductive contacts (e.g., via contacts) that are formed in the PMD layer. The PMD layer is formed over the components and devices of the FEOL layer. A pattern of openings is formed in the PMD layer, and the openings are filled with a conductive material, such as tungsten, to form conductive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure. As is known in the art, a BEOL structure comprises multiple levels of dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In the exemplary embodiment of FIG. 1, the insulating layer 110 generically represents an interlevel dielectric layer (ILD layer) that forms a given interconnect level of a BEOL, layer, and which is to be patterned using methods as discussed below to form a pattern of openings (e.g., trenches or vias) in the insulating layer 110, which are to be filled with metallic materials such as copper to form wiring and vertical via structures, etc. The insulating layer 110 can be formed using any suitable dielectric material including, but not limited to, silicon oxide (e.g. SiO2), a silicon-nitride (SiN) material (e.g., (Si3N4), hydrogenated silicon carbon oxide (SiCOH), silicon based low-k dielectrics, porous dielectrics, or other known ULK (ultra-low-k) dielectric materials. The insulating layer 110 can be deposited using known deposition techniques, such as, for example, atomic layer deposition (ALD), plasma enhanced ALD (PEALD), chemical vapor deposition (CVD), plasma-enhanced CVD (PECVD), physical vapor deposition (PVD), ionized PVD (iPVD), or a spin-on technique. The thickness of the insulating layer 110 will vary depending on the application, and may have a thickness in a range of about 30 nm to about 800 nm, for example.

The sacrificial hard mask layer 120 may comprise a sacrificial nitride layer which facilitates adhesion between the material of the etch mask pattern 130 and the insulating layer 110 and which allows over etching of the material of the etch mask pattern 130 for a wider process window during the later etch-back without damaging the underling insulating layer 110. The etch mask pattern 130 is formed by depositing one or more layers and patterning the layers using EUV lithographic techniques discussed herein, for example, to form the etch mask pattern 130. The etch mask pattern 130 can be utilized in a subsequent process module to etch the underlying insulating layer 110. For example, the etch mask pattern 130 may comprise a first layer 132, e.g., a titanium nitride (TiN) layer, and a second layer 134, e.g., an oxide layer such as tetraethyl orthosilicate (TEOS).

The OPL 140 is formed over the etch mask pattern 130 using known organic materials and techniques. For example, the OPL 140 may comprise a resin material that is applied by spin coating and baked to enhance planarization. The OPL 140 may comprise a liquid monomer that is applied by spin coating and photochemically hardened. In some embodiments, the OPL 140 is formed to a thickness of approximately 60 nm, although these and other dimensions are presented herein as illustrative examples and should not be construed as limiting.

The hard mask layer 150 is formed over the OPL 140. In some embodiments, the hard mask layer 150 serves as an ARC (anti reflection coating) layer. In some embodiments, the hard mask layer 150 may be formed, for example, using atomic layer deposition, plasma assisted deposition, or using other similar processes. Hard mask layer 150 may be formed of silicon-based materials such as silicon oxide, silicon nitride or silicon oxynitride, although a wide variety of other inorganic or organic materials could be used. Additional examples of inorganic materials that may be used to form the hard mask layer 150 include metal-containing materials such as, e.g., titanium-oxide (TiO) materials or titanium-nitride (TiN) materials. Numerous other metal oxides, metal nitrides and/or metal oxynitrides, as well as other types of metal-containing materials, could be used. The hard mask layer 150 may have a thickness in the range of about 3 nm to about 15 nm.

Figure 2:
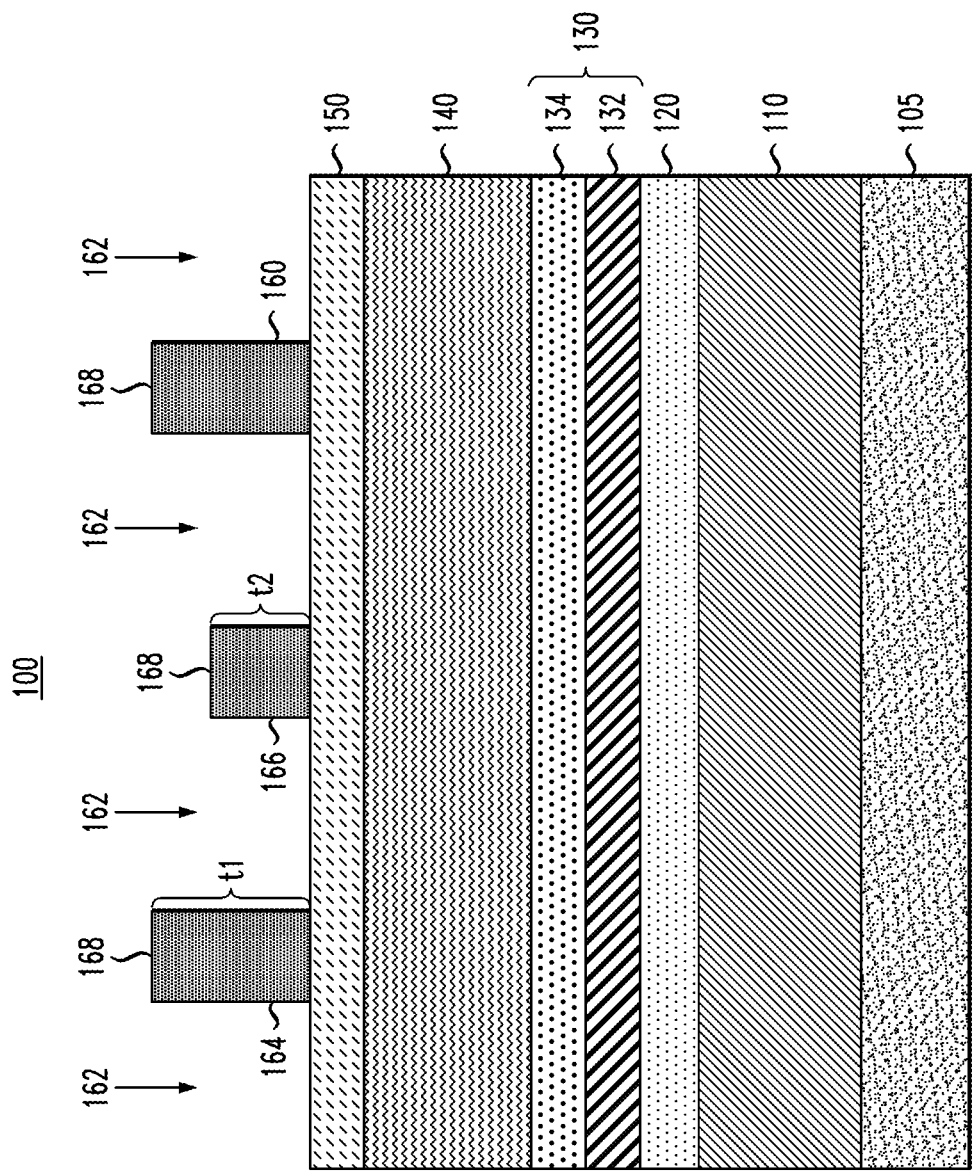

FIG. 2 is a schematic cross-sectional side view of the semiconductor device of FIG. 1, which shows a layer of EUV resist mask 160 formed over the hard mask layer 150. For example, a layer of EUV resist material comprising a photosensitive material suitable for patterning using an EUV radiation source and a corresponding photomask may be formed over the hard mask layer 150. The layer of EUV resist material comprises an organic EUV photoresist, and more particularly an organic chemically-amplified photoresist, although other types of resist materials can be used. In one embodiment, the layer of EUV resist material is formed with a thickness T in a range of about 10 nm to about 40 nm. FIG. 2 illustrates the EUV resist material after exposing and developing the layer of EUV resist material to form EUV resist mask 160. The layer of EUV resist material can be exposed and developed using techniques known to those of ordinary skill in the art, the details of which are not necessary for understanding the methods discussed herein. Briefly, the layer of EUV resist material is exposed to an EUV radiation source through an image pattern using an EUV lithography tool, and the exposed layer of EUV resist material is developed in a developing solvent to form the EUV resist mask 160 by removing the irradiated regions of the layer of EUV resist material (as in the case of positive photo-resist), or non-irradiated regions of the layer of EUV resist material (as in the case of negative resist) using a developing solvent. The resulting EUV resist mask 160 comprises a plurality of openings 162 that define images of openings to be transferred into underlying hard mask layer 150 and the OPL 140.

As seen in FIG. 2, in some embodiments, one or more portions of the EUV resist mask 160 may form with different thicknesses. For example, a portion of a patterning feature of the EUV resist mask 160, e.g., a line or other feature, may be formed with a dent or have a depression that results in a smaller thickness than other portions of the patterning feature or other patterning features of the EUV resist mask 160 that are fully formed. For example, a first portion 164 of EUV resist mask 160 may have a first thickness, t1, while a second portion 166 of EUV resist mask 160 may have a second, smaller thickness, t2. Such a smaller thickness in a portion of EUV resist mask 160 may result in broken lines during subsequent transfer of the pattern of the image openings 162 into the underlying hard mask layer 150 and OPL 140. For example, the portion of the patterning features 168 having the smaller thickness may be fully etched away during pattern transfer while the other portions having a greater thickness are not fully etched away. This may result in one or more openings in addition to the pattern of the image openings 162 being transferred to the underlying hard mask layer 150 and OPL 140, i.e., a line break in the pattern.

Figure 3:
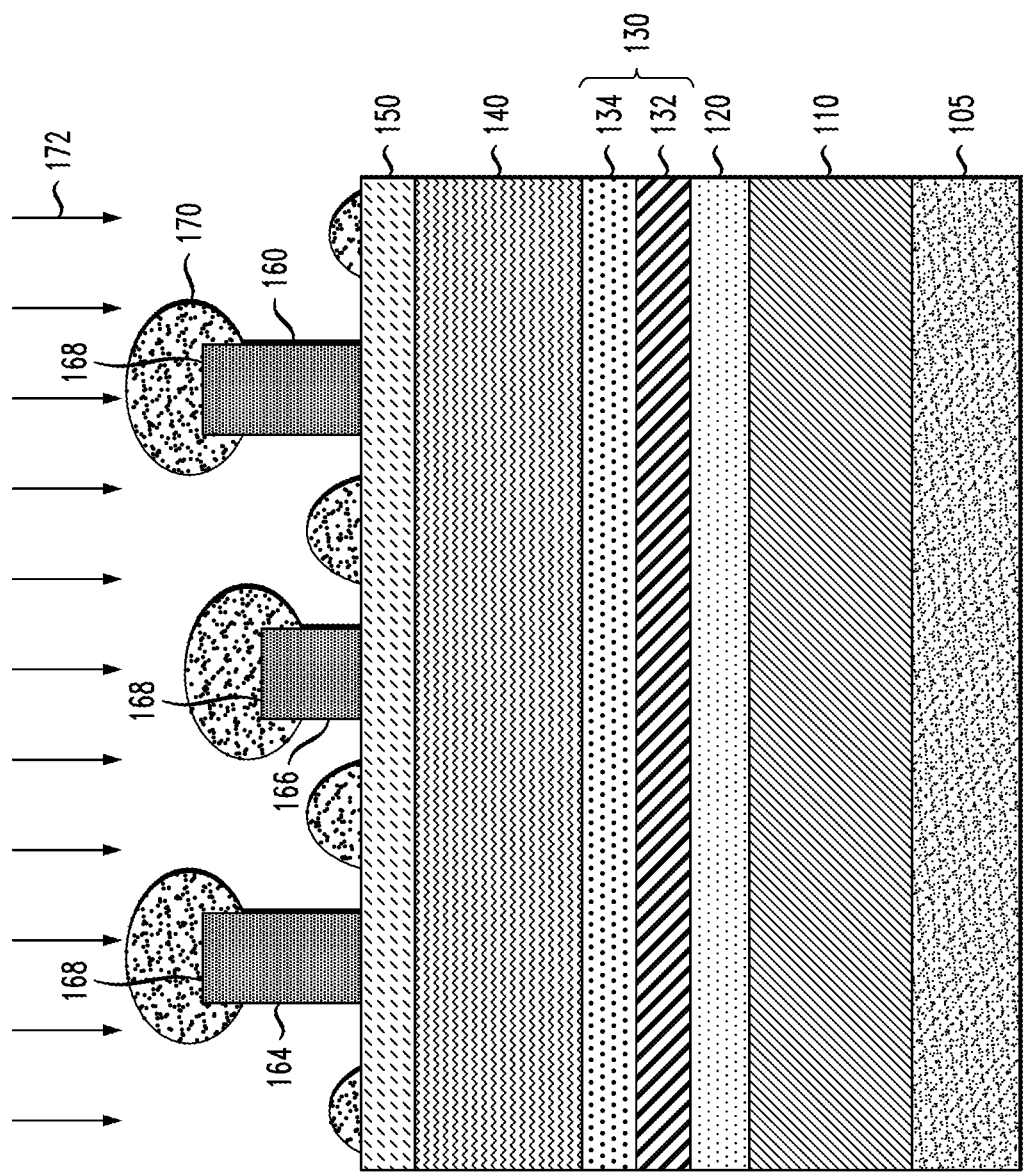

FIG. 3 is a schematic cross-sectional side view of the semiconductor device of FIG. 2, which shows a directional deposition of a hard mask material on the substrate structure to form a hard mask layer 170 on a surface of the EUV resist mask 160. For example, the hard mask material may be deposited in a direction 172 with a greater thickness of the deposition on patterning features 168 of the EUV resist mask 160 than between the patterning features 168 of EUV resist mask 160, e.g., in openings 162, on surfaces of hard mask layer 150, and little to no deposition on the side walls of EUV resist mask 160. For example, the hard mask layer 170 may cover the patterning features 168 of EUV resist mask 160. In some embodiments, the hard mask material may be deposited by, e.g., radio frequency physical vapor deposition (RF PVD) directional sputtering. In some embodiments, for example, the hard mask material may be deposited using a bias of 200-400 W. In some embodiments, the hard mask material may be deposited using pressure of 2.5-4 mtorr. In some embodiments, the hard mask material may comprise, for example, silicon nitride (SiN), silicon dioxide ($SiO_2$), a silicon-nitrogen-oxide (SiNO) material, a silicon-carbon-oxide (SiCO) material (e.g., oxygen-doped silicon carbide film), a metal oxide, a metal nitride, or a metal oxynitride. For example, in some embodiments the metal oxide, metal nitride, or metal oxynitride may comprise, e.g., tungsten (W), tantalum (Ta), titanium (Ti), aluminum (Al), hafnium (Hf), zinc (Zn), zirconium (Zr), tin (Sn), or other similar metals.

Figure 4:
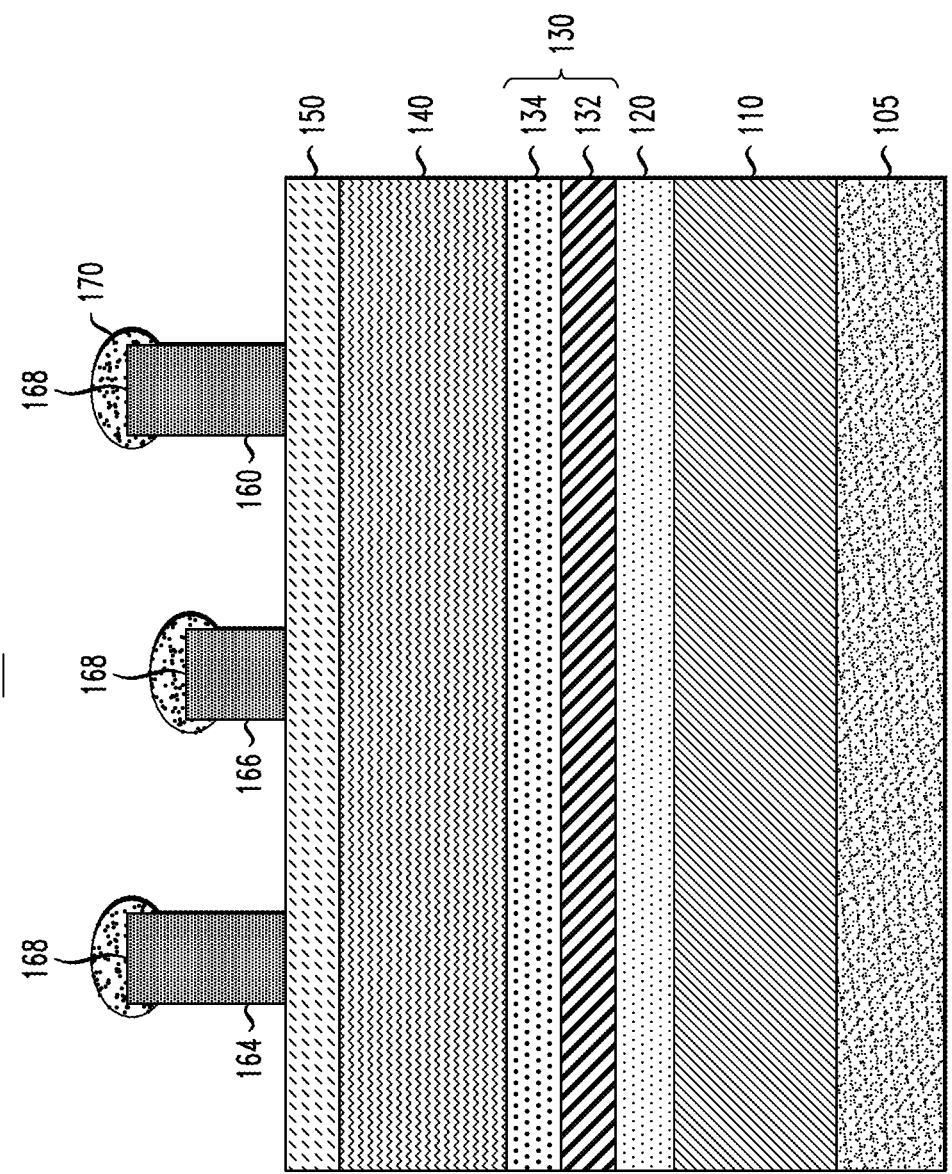

FIG. 4 illustrates a schematic cross-sectional side view of the semiconductor device of FIG. 3, which shows a selective etch of the hard mask layer 170. For example, the hard mask layer 170 may be selectively etched relative to hard mask layer 150 using a reactive ion etch (RIE), e.g., using tetrafluoromethane ($CF_4$) or fluoromethane ($CH_3F$)/$CF_4$, or other fluorine-based chemistry, to reduce the thickness of hard mask layer 170 on the patterning features 168 of the EUV resist mask 160 while removing the portions of hard mask layer 170 that were formed on hard mask layer 150. As illustrated in FIG. 4, for example, the hard mask layer 170 is still disposed on and covers the patterning features 168 of the EUV resist mask 160 while the portions of hard mask layer 170 that were disposed on hard mask layer 150 have been removed by the RIE etch. In some illustrative embodiments, the thickness of hard mask layer 170 after selective etching may be approximately 4 nm to 10 nm.

Figure 5:
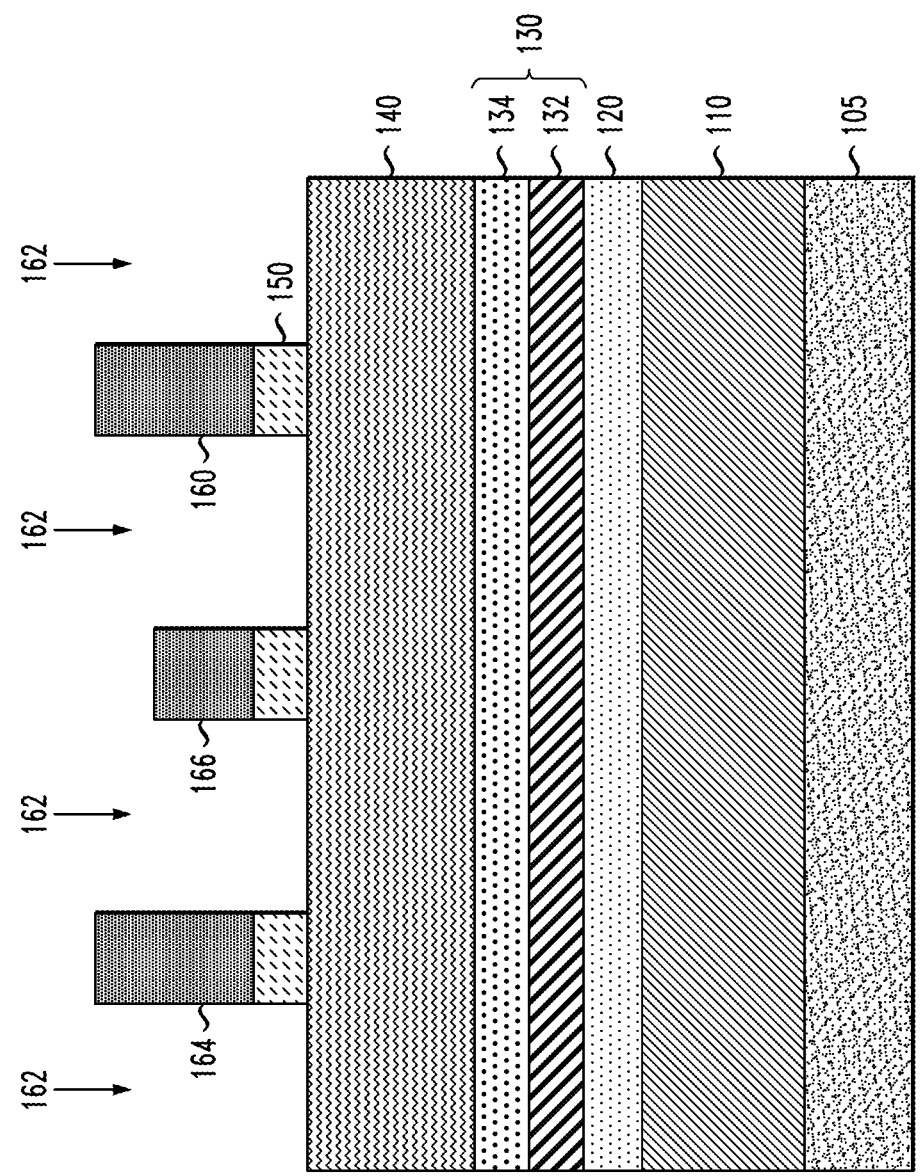

FIG. 5 illustrates a schematic cross-sectional side view of the semiconductor device of FIG. 4, after patterning the underlying hard mask layer 150 using the EUV resist mask 160 and hard mask layer 170. Patterning the underlying hard mask layer 150 may comprise applying one or more processes which result in a transfer of the image of the openings 162 into the hard mask layer 150. In some embodiments, for example, patterning the hard mask layer 150 may comprise descumming the surface of hard mask layer 150 to remove residual EUV resist material or other material, e.g., using an oxygen based descumming process. For example, oxygen (02) may be used during the descumming process. In some embodiments, for example, the etch selectivity between hard mask layer 170 and hard mask layer 150 may be greater than the etch selectivity between EUV resist mask 160 and hard mask layer 170. For example, during the patterning etch of hard mask layer 150, hard mask layer 170 will serve as a mask and remain on EUV resist mask 160 to protect against line breaks due to over etching of the portion 166 of EUV resist mask 160 that has the smaller thickness during transfer of the pattern to hard mask layer 150.

In some embodiments, patterning the hard mask layer 150 may comprise performing an atomic layer etch (ALE), e.g., using silicon tetrachloride ($SiCl_4$) as a deposition material.

In some embodiments, patterning the hard mask layer 150 may comprise performing etching, e.g., using $CF_4$ or other similar etch chemistry, to transfer the pattern to the hard mask layer 150 to remove the hard mask layer 170. This results in the pattern illustrated in FIG. 5, where, for example, the pattern from the EUV resist mask 160 has been transferred to the hard mask layer 150 and the hard mask layer 170 has been removed. As can be seen in FIG. 5, while second portion 166 of EUV resist mask 160 still has a smaller thickness than first portion 164, no break in the patterning features 168 of EUV resist mask 160 has occurred during the etching to transfer the image of the openings 162 to the hard mask layer 150 and the hard mask layer 150 has received the pattern defined by the image of the openings 162 of the EUV resist mask 160.

Figure 6:
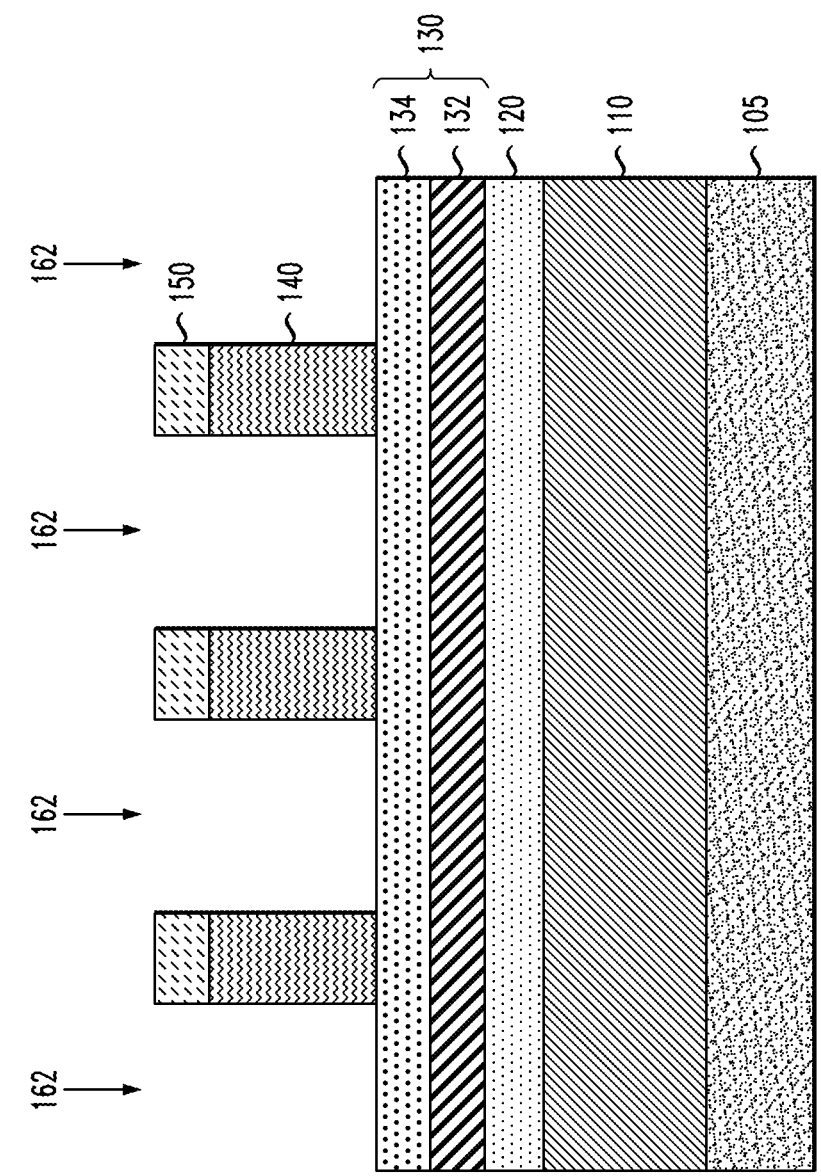

FIG. 6 is a schematic cross-sectional side view of the semiconductor device of FIG. 5, after patterning the underlying OPL 140 using the pattern transferred to the hard mask layer 150 and removal of the EUV resist mask 160. Patterning the OPL 140 may comprise applying one or more processes which result in a transfer of the image of the openings 162 into the OPL 140. In some embodiments, for example, OPL 140 may be etched using a dry etch process such as, e.g., RIE, having an etch chemistry which is configured to etch the material of the OPL 140 selective to the materials of the etch mask pattern 130 and the sacrificial hard mask layer 120 to transfer the image of the openings 162 into the OPL 140. In some embodiments, the processes used to pattern the OPL 140 may also remove EUV resist mask 160. In some embodiments, example etch chemistries for etching OPL 140 may comprise a nitrogen-based chemistry (e.g., $N_2$)/a hydrogen-based chemistry (e.g., $H_2$), a helium-based chemistry (He), a carbon-oxide based chemistry (e.g., CO/$CO_2$), and a sulfur-oxygen based chemistry (e.g., sulfur dioxide ($SO_2$)) or combinations thereof. In some embodiments, example etch chemistries for etching OPL 140 may comprise a hydrogen-bromide based chemistry (e.g., HBr)/oxygen-based chemistry (e.g., $O_2$), or combinations thereof. In some embodiments, example etch chemistries for etching OPL 140 may comprise a sulfur-oxygen based chemistry (e.g., $SO_2$)/oxygen-based chemistry (e.g., $O_2$), or combinations thereof.

Figure 7:
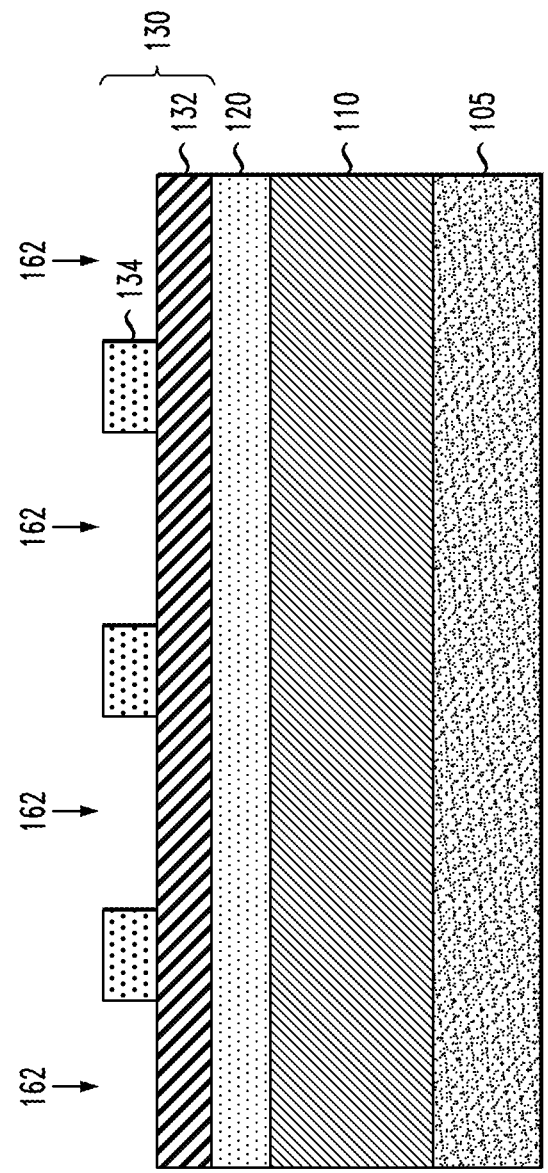

FIG. 7 is a schematic cross-sectional side view of the semiconductor device of FIG. 6, after patterning the second layer 134 of the etch mask pattern 130 using the pattern transferred to the OPL 140 and removal of the hard mask layer 150 and OPL 140. In some embodiments, for example, the second layer 134 of the etch mask pattern 130 may be patterned with the image of the openings 162 by a dry etch such as, e.g., a RIE. For example, as mentioned above, second layer 134 may comprise an oxide layer such as TEOS which may be dry etched using, e.g., a fluoride-based chemistry such as, e.g., tetrafluoromethane ($CF_4$), hexafluoro-2-butyne ($C_4F_6$, also known as HFB), octafluorocyclobutane ($C_4F_8$), fluoroform ($CHF_3$), or other similar chemistry, Hard mask layer 150 may be removed, for example, during etching of second layer 134. For example, the same etch chemistry may be used to both pattern second layer 134 and burn off hard mask layer 150.

In some embodiments, for example, the remaining portions of OPL 140 may be removed using oxygen-based chemistry, for example, using an $O_2$ gas after patterning the second layer 134 of the etch mask pattern 130. In some embodiments, the remaining portions of OPL 140 may be removed using any of the etch chemistries described above for patterning OPL 140. In some embodiments, the etch chemistries used to pattern second layer 134 may also remove OPL 140.

Figure 8:
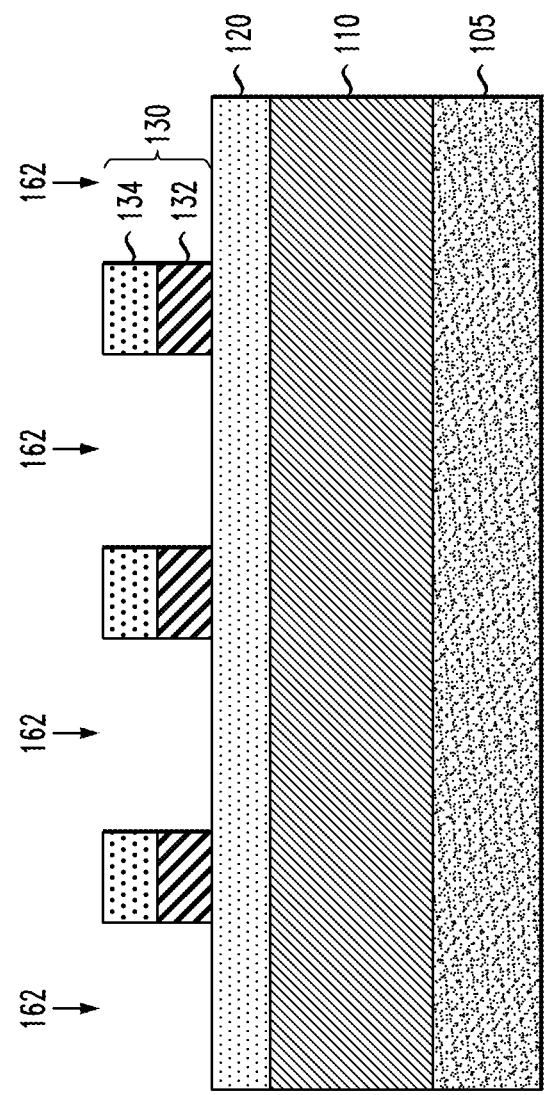

FIG. 8 is a schematic cross-sectional side view of the semiconductor device of FIG. 7, after patterning the first layer 132 of the etch mask pattern 130 using the pattern transferred to the second layer 134 of the etch mask pattern 130. In some embodiments, for example, the first layer 132 of etch mask pattern 130 may be patterned with the image of the openings 162, for example, by a dry etch such as, e.g., a RIE. For example, as mentioned above, first layer 132 may comprise a metal containing layer such as titanium nitride (TiN) which may be dry etched using, e.g., dichloride ($Cl_2$)/methane ($CH_4$) or other similar chemistry.

In some embodiments, the remaining portions of OPL 140 may alternatively be removed after patterning of the first layer 132 of the etch mask pattern 130 is complete.

Figure 9:
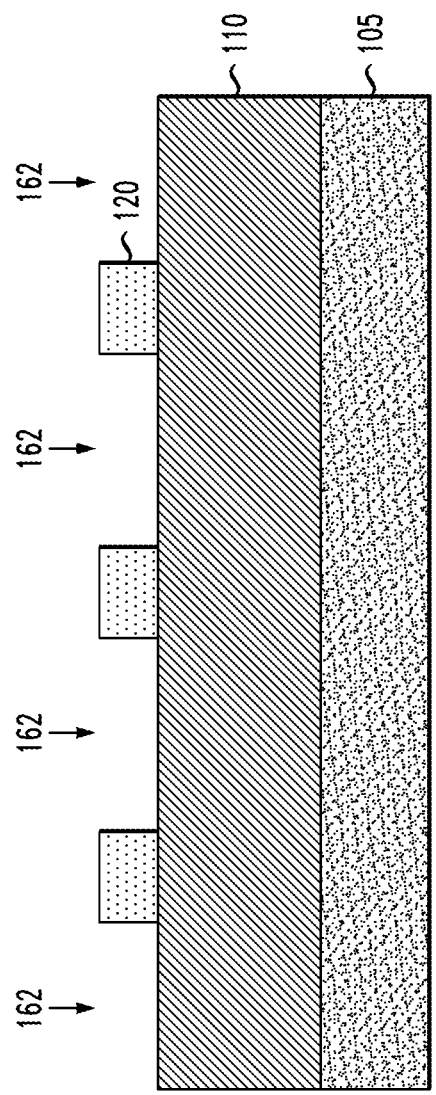

FIG. 9 is a schematic cross-sectional side view of the semiconductor device of FIG. 8, after patterning the sacrificial hard mask layer 120 using the pattern transferred to the etch mask pattern 130. For example, another dry etch process is performed to etch the sacrificial hard mask layer 120 to transfer the image of the openings 162 into the sacrificial hard mask layer 120.

Figure 10:
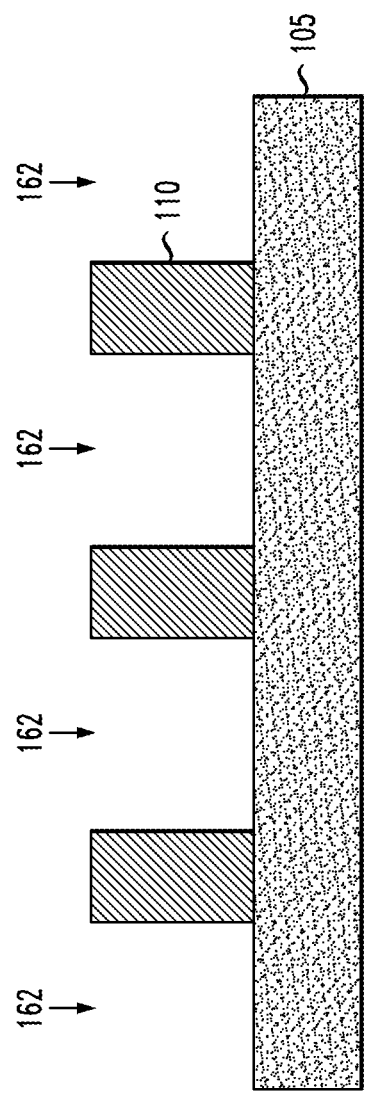

FIG. 10 is a schematic cross-sectional side view of the semiconductor device of FIG. 9, after patterning the insulating layer 110 using the pattern transferred to the sacrificial hard mask layer 120. For example, the insulating layer 110 can be patterned using the patterned sacrificial hard mask layer 120 as an etch mask to form via openings in the insulating layer 110.

It is to be understood that the patterning methods discussed herein can be incorporated within semiconductor processing flows for fabricating various types of semiconductor devices and integrated circuits having analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A semiconductor structure comprising:
a substrate structure comprising an extreme ultraviolet resist mask disposed over one or more additional layers of the substrate structure, the extreme ultraviolet resist mask defining patterning features; and
a hard mask layer comprising a hard mask material disposed on the extreme ultraviolet resist mask and covering the patterning features of the extreme ultraviolet resist mask;
wherein the extreme ultraviolet resist mask includes at least first and second mask portions; and
wherein the first mask portion and the second mask portion each define side walls, the side walls being substantially devoid of the hard mask material.

2. The semiconductor structure of claim 1 wherein the hard mask layer is formed on the extreme ultraviolet resist mask using directional deposition of the hard mask material on the substrate structure.

3. The semiconductor structure of claim 2, wherein the substrate structure underlying the extreme ultraviolet resist mask is devoid of the hard mask material.

4. The semiconductor structure of claim 1, wherein the first mask portion defines a first thickness and the second mask portion defines a second thickness greater than the first thickness.

5. The semiconductor structure of claim 4, wherein the first thickness of the first mask portion and the second thickness of the second mask portion is defined in a direction of a directional deposition of the hard mask material.

6. The semiconductor structure of claim 1, wherein the extreme ultraviolet resist mask material comprises an organic extreme ultraviolet material.

7. The semiconductor structure of claim 6, wherein the extreme ultraviolet resist mask material comprises an organic chemically-amplified extreme ultraviolet material.

8. The semiconductor structure of claim 1, wherein the hard mask material comprises a material selected from the group consisting of silicon nitride (SiN), silicon dioxide ($SiO_2$), silicon oxynitride (SiNO), silicon oxycarbide (SiCO), a metal oxide, a metal nitride, a metal oxynitride, a tungsten (W) based material, a tantalum (Ta) based material, a titanium (Ti) based material, an aluminum (Al) based material, a hafnium (Hf) based material, a zinc (Zn) based material, a zirconium (Zr) based material, and a tin (Sn) based material or combinations thereof.

9. The semiconductor structure of claim 1, wherein the one or more additional layers of the substrate structure comprises a silicon-based material.

10. The semiconductor structure of claim 9, including an anti-reflection coating on the one or more additional layers.

11. The semiconductor structure of claim 9, wherein the extreme ultraviolet resist mask comprises a plurality of openings disposed between the patterning features that define images of openings to be patterned into the at least one layer of the substrate structure.

12. The semiconductor structure of claim 11, wherein the at least one layer of the substrate structure comprises an underlying layer.

13. A semiconductor structure, comprising:
a substrate comprising a first hard mask layer;
a resist mask over the hard mask layer, the resist mask comprising patterning features that define an image of openings therebetween, the image of openings to be used for patterning at least one layer of the substrate; and
a hard mask material forming a second hard mask layer that covers the patterning features of the resist mask without substantial covering of portions of the first hard mask layer disposed between the openings of the image of the resist mask;
wherein the resist mask includes at least first and second mask portions, the first mask portion defining a first thickness and the second mask portion defining a second thickness greater than the first thickness; and wherein the first mask portion is spaced from the second mask portion.

14. The semiconductor device of claim 13, wherein the resist mask comprises an extreme ultraviolet resist mask material.

15. The semiconductor device of claim 13, wherein the first hard mask layer comprises an anti-reflection coating.

16. A semiconductor device, comprising:

a semiconductor substrate;

one or more layers disposed on the semiconductor substrate;

a first hard mask layer disposed on the one or more layers;

a resist mask disposed on the hard mask layer, the resist mask comprising a pattern defining image openings to be used for patterning the one or more layers, the pattern including at least first and second mask portions with at least one of the image openings disposed therebetween, the first mask portion defining a first thickness and the second mask portion defining a second thickness greater than the first thickness, each of the first and second mask portions extending from the first hard mask layer to define respective upper surfaces and side wall surfaces; and a hard mask material forming a second hard mask layer that covers the upper surfaces of the first and second mask portions whereby the side wall surfaces of the first and second mask portions and portions of the first hard mask layer disposed between the image openings of the resist mask are substantially devoid of the hard mask material.

17. The semiconductor device of claim 16, wherein the resist mask comprises an extreme ultraviolet resist mask material.

18. The semiconductor structure of claim 14, wherein the extreme ultraviolet resist mask material comprises an organic extreme ultraviolet material.

19. The semiconductor structure of claim 14, wherein the extreme ultraviolet resist mask material comprises an organic chemically-amplified extreme ultraviolet material.

20. The semiconductor structure of claim 17, wherein the extreme ultraviolet material of the resist mask comprises an organic extreme ultraviolet material.

\* \* \* \* \*